United States Patent
Lewis

(10) Patent No.: US 7,313,374 B2
(45) Date of Patent: Dec. 25, 2007

(54) LOW-LATENCY DC COMPENSATION

(75) Inventor: Michael Lewis, Märsta (SE)

(73) Assignee: Infineon Technologies AG, Munich (DE)

( * ) Notice: Subject to any disclaimer, the term of this patent is extended or adjusted under 35 U.S.C. 154(b) by 382 days.

(21) Appl. No.: 10/909,166

(22) Filed: Jul. 30, 2004

(65) Prior Publication Data

US 2005/0026584 A1 Feb. 3, 2005

(30) Foreign Application Priority Data

Aug. 1, 2003 (SE) .................. 0302156

(51) Int. Cl.
*H04B 1/06* (2006.01)
*H04B 7/00* (2006.01)

(52) U.S. Cl. ............ 455/130; 455/63.1; 455/67.13; 455/234.1; 455/296; 375/319

(58) Field of Classification Search .......... 455/67.1, 455/67.11, 67.13, 232.1–253.2; 375/317–319
See application file for complete search history.

(56) References Cited

U.S. PATENT DOCUMENTS

| | | | |
|---|---|---|---|
| 4,376,288 A | 3/1983 | Shanley, II et al. ........ 358/39 |
| 5,241,702 A | 8/1993 | Dent ................ 455/278.1 |
| 6,240,100 B1 * | 5/2001 | Riordan et al. .......... 370/442 |
| 6,321,073 B1 | 11/2001 | Luz et al. ............. 455/239.1 |
| 6,370,205 B1 * | 4/2002 | Lindoff et al. ............ 375/319 |
| 6,498,929 B1 * | 12/2002 | Tsurumi et al. ........... 455/296 |
| 6,516,185 B1 * | 2/2003 | MacNally ............. 455/234.1 |
| 6,654,593 B1 | 11/2003 | Simmons et al. ........ 455/234.1 |
| 6,748,200 B1 * | 6/2004 | Webster et al. ......... 455/234.1 |
| 6,771,945 B1 * | 8/2004 | Pickett et al. ............ 455/324 |
| 7,062,243 B2 * | 6/2006 | Simmons et al. ........ 455/234.1 |
| 2003/0091101 A1 * | 5/2003 | Lindoff et al. ............ 375/147 |
| 2005/0079850 A1 * | 4/2005 | Chen et al. ............. 455/324 |

FOREIGN PATENT DOCUMENTS

| | | |
|---|---|---|
| EP | 0 758 162 A2 | 7/1996 |
| WO | 01/03395 A1 | 1/2001 |

* cited by examiner

*Primary Examiner*—Simon Nguyen
(74) *Attorney, Agent, or Firm*—Baker Botts L.L.P.

(57) ABSTRACT

A method of performing DC estimation and correction in the presence of an automatic gain control function introduces no long-term delay of the signal. When the automatic gain control function indicates that it has altered the gain or when an initial DC estimate is required after switch-on, a new DC estimate is begun. Input samples received at the signal-sampling rate are stored in a first-in first-out buffer, while waiting for sufficient samples to have been received to perform the DC estimate. Once sufficient samples have been received to calculate a DC estimate, the data that has been stored in the FIFO is read out and processed by subsequent signal processing functions at a higher rate than the data-sampling rate. Due to the higher rate of read-out, the FIFO is rapidly emptied so that the subsequent signal processing functions "catch up" with the input data stream leading to no long-term latency.

16 Claims, 5 Drawing Sheets

LOW-LATENCY DC COMPENSATION

PRIORITY

This application claims priority to Swedish application no. 0302156-5 filed Aug. 1, 2003.

TECHNICAL FIELD OF THE INVENTION

The present invention relates to an apparatus for DC compensation and a method therefore. More specifically, the present invention relates to an apparatus and a method for receiving a signal, where imperfections in the analogue components lead to an unwanted DC offset in the sampled digital signal, where the level of the DC offset changes according to the gain setting of the receiver, and where there is a requirement to detect an incoming signal with a minimum of latency.

BACKGROUND OF THE INVENTION

In typical receiver equipment, particularly radio receivers, imperfections or design compromises lead to unwanted spurious signals being introduced. A common type of spurious signal is zero frequency (DC) components in the signal, generated either directly, such as occurs due to e.g. bias voltages in amplifiers, or resulting spurious signals whose frequency is shifted by subsequent signal processing so that they lie at DC, as can occur in radio receiver systems using a sampled digital low-IF concept. Such signals generally interfere with the proper operation of digital receiver circuitry, and therefore must be removed by some form of compensation.

A typical receiver performs automatic gain control (AGC), which periodically adjusts the gain of the receiver to match the strength of the incoming signal. Since spurious signals generated within the analogue receiver will experience this changing gain, the resulting DC signal level will vary, making the task of eliminating the signal difficult. A simplified example is shown in FIG. 1 where the RF mixer 106 introduces a small DC offset that is subsequently amplified by the programmable PGA 102 gain, which PGA 102 is controlled by a digital controller 103, and where the DC offset appears on the input to the analogue-to-digital converter (ADC) 101 on the digital chip 105.

AGC is most often used while searching for the start of a signal. Once a signal has been detected, a fixed gain setting may be chosen to match the strength of the incoming signal. This detection process is often time-critical. For example, in the 802.11 wireless LAN standard there is a defined maximum time by which the presence of valid signals must be indicated. This means that any method for compensating for DC offsets must not delay or distort the signal so that more time is required to distinguish a valid signal.

A standard method for eliminating DC components in a signal is to use a DC-blocking digital notch filter. This has the properties of completely blocking DC signals while passing higher frequencies, with very small delay to frequencies significantly higher than the cut-off frequency.

A second standard method for eliminating DC components in a signal is to use DC estimation and subtraction, where the mean signal level is measured over a period of time to calculate an estimate of the DC level, after which the estimate is subtracted from the data samples to remove the DC component.

One problem with the notch filter approach is that it introduces phase and amplitude distortion to the signal. The amount of distortion can be minimised by making the filter cut-off frequency small compared to the lowest wanted signal frequency. However, the filter also has a finite response time to step changes in DC level, which is proportional to the inverse of the filter cut-off frequency. The result is that when the AGC process changes the signal gain, the resulting step change in DC level at the input to the filter causes a transient pulse at the output.

The problem with the estimation/subtraction method is that the accuracy of the DC estimation depends on the number of samples over which the estimate can be performed. This either introduces a delay in the signal, or requires that the samples contributing to the DC estimate are not correctly compensated.

SUMMARY OF THE INVENTION

It is a main object of the present invention to provide such apparatus and method that at least alleviate the above problems.

It is in this respect a particular object of the invention to provide such apparatus and method that compensate for a DC component in a received signal without introducing any substantial long-term latency of the signal.

The invention can in general terms be described as a method of performing DC estimation and correction in the presence of an automatic gain control function, without introducing long-term delay of the signal. When the automatic gain control function indicates that it has altered the gain or when an initial DC estimate is required after switch-on, a new DC estimate is begun. Input samples received at the signal-sampling rate are stored in a first-in first-out (FIFO) buffer, while waiting for sufficient samples to have been received to perform the DC estimate. Once sufficient samples have been received to calculate a DC estimate, the data that has been stored in the FIFO is read out and processed by subsequent signal processing functions at a higher rate than the data-sampling rate. Due to the higher rate of read-out, the FIFO is rapidly emptied so that the subsequent signal processing functions "catch up" with the input data stream leading to no long-term latency.

A refinement of the invention, where the time between gain changes can be greater than the minimum required for a DC estimate, is to use subsequent samples to refine the DC estimate. A suitable method to refine the samples is to pass them through a recursive filter.

A further refinement can be made for situations where it is possible that a limited number of gain changes can occur in less than the desired time for a DC estimate. Ongoing DC estimates may be interrupted by gain change indications; the sub-optimal estimate from the incomplete estimation may be used to correct the associated samples, at the same time that a new DC estimate is begun. The number of such interrupted estimations is limited by the practical number of samples that it is worthwhile making a DC estimate over, and the amount of storage that can be dedicated to incomplete estimate results and the associated state information.

These objects among others are, according to a first aspect of the present invention, attained by an apparatus for performing DC estimation of a received signal and DC correction of said received signal. The apparatus comprises an automatic gain control circuit arranged to change the gain of an amplifier stage in dependence of the received signal strength, and is characterised in a FIFO buffer comprising an input and an output, where said input is coupled to said amplifier stage for receiving said signal. A DC estimation circuit coupled to said amplifier stage and which is arranged to perform an estimation of the DC component in said signal, the DC estimation circuit is further connected to the output of the FIFO buffer and arranged to subtract the DC estimation from the signal on the output from the FIFO buffer. A digital controller is coupled to the FIFO buffer and to the DC estimation circuit. The digital controller is arranged to control the FIFO buffer to store incoming samples and prevent output from the FIFO buffer during a period when the DC estimation circuit calculates the DC estimation.

The above objects among others are, according to a second aspect of the present invention, attained by a method for calculating a DC estimate of a signal and correcting said signal using said DC estimate comprising an automatic gain control function, wherein the automatic gain control function controls the gain of an amplifier stage for amplifying the signal. The method is characterised in the steps of receiving samples from the amplified signal at a first rate. An estimate of a DC component is calculated from the amplified signal, by firstly receiving a number of samples from said amplified signal and calculating an estimate of a DC component from the received samples using a function F(n), where n is the number of samples. The received samples are stored in a FIFO buffer during the calculation of the estimate of the DC component. Finally the samples are read, at a second rate, from the FIFO buffer, when said calculation is finished, and where the second rate is higher than the first rate. The samples read from the FIFO buffer are corrected by subtracting the DC estimate from the samples that are output from the FIFO buffer.

By storing the signal in a FIFO buffer during calculation of a DC estimate, which DC estimate is to be used in correcting the received signal, and reading the stored samples from the FIFO buffer faster than new samples is received in the FIFO buffer, when the calculation is finished, a compensation of the DC component in a signal can be achieved without causing any long-term latency in the compensated signal.

According to a preferred embodiment of the present invention the apparatus comprises a register for storing the DC estimate, the register is coupled to a first terminal on the digital controller and to the DC estimation circuit. The digital controller is arranged to raise the first terminal to order said register to load and store a DC estimation value from said DC estimation circuit, and the register is further coupled to the output of said FIFO buffer and arranged to subtract the value of said stored DC estimate from the output from said FIFO buffer. The register is loaded with the calculated DC estimate value when the calculation is finished.

By having a separate register for storing the DC estimate value the digital controller can determine when to store the DC estimate and thus when a specific DC estimate should be available for correcting signal samples.

According to a preferred embodiment of the present invention the digital controller comprises a second terminal coupled to the FIFO buffer, and the digital controller is arranged to raise the second terminal to allow the FIFO buffer to present signals on said output, and to lower the second terminal to prevent the FIFO buffer from presenting signals on the output.

By preventing reading of samples from the FIFO buffer when calculation of a DC estimate is ongoing, and allowing reading of samples from the FIFO buffer, when calculation of a DC estimate is not ongoing, a correct DC estimate is available for correction of the samples stored in the FIFO buffer when they are read from the FIFO buffer after the calculation of the DC estimate is finished.

According to a preferred embodiment of the present invention the digital controller comprises a third terminal coupled to the automatic gain control. The automatic gain control is arranged to raise the third terminal when the automatic gain control has changed the gain for the amplifier stage.

By receiving an indication from the automatic gain control function when the gain for the amplifier stage has changed, and performing the step of calculating an estimate of a DC component upon receiving the indication from said automatic gain control, a new DC estimate is calculated whenever the gain in the amplifier stage is changed. This is beneficial or even necessary since, when the gain in the amplifier stage changes, the DC component in the signal will also change.

According to a preferred embodiment of the present invention the FIFO buffer and the DC estimation circuit are arranged to receive samples from the digital signal at a first rate and the FIFO buffer is arranged to present samples on the output at a second rate, where the second rate is higher than the first rate.

By reading samples from the FIFO buffer at the second rate when the FIFO buffer contains samples stored during calculation of said DC estimate, and reading samples at the first rate otherwise, the FIFO buffer will be emptied after a DC estimation calculation has been performed. Even though a short-term latency is introduced during the calculation of the DC-estimate, a long-term latency can be avoided since the FIFO buffer will not store, and thus delay, any samples when no DC estimate is performed.

According to a preferred embodiment of the present invention the digital controller is arranged to lower the second terminal and to count the number of samples received by the DC estimation circuit when the third terminal is raised. The digital controller is further arranged to raise the first terminal and, after that, raise the second terminal when the DC estimate circuit has received a predetermined number of samples.

According to a preferred embodiment of the present invention the DC estimation circuit is arranged to continuously calculate new DC estimates after a first DC estimate has been calculated, and arranged to use said new DC estimate when correcting subsequent samples.

By calculating a DC estimate in an initial stage, when no DC estimate is available, and using new input samples to continuously update the DC estimate, while allowing samples to be read from the FIFO buffer, and using the updated DC estimate to correct samples output from said FIFO buffer, after the calculation of an initial DC estimate, improved DC estimates are achieved when more samples are available for calculating the DC estimate without causing any unnecessary short-term latency, or keeping the short-term latency small.

According to a preferred embodiment of the present invention, if an indication is received from said automatic gain control function, indicating that the gain for said amplifier stage has changed, while said FIFO buffer still holds samples stored during a previous calculation of a DC estimate, said samples stored in said FIFO buffer are read from said FIFO buffer and corrected using the previously calculated DC estimate.

By this arrangement, a first DC estimate value is used for correcting signal samples, which have been amplified by the amplification stage using a first gain, and a new DC estimate value, to be used for correcting subsequent signal samples, is calculated from signal samples, which have been amplified by the amplification stage using a second gain.

Further characteristics of the invention and advantages thereof will be evident from the following detailed description of embodiments of the invention.

BRIEF DESCRIPTION OF THE DRAWINGS

The present invention will become more fully understood from the detailed description of embodiments of the present invention given herein below and the accompanying FIGS. 1–5, which are given by way of illustration only, and thus are not limitative of the present invention.

PREFERRED EMBODIMENTS OF THE INVENTION

In the following description, for purposes of explanation and not limitation, specific details are set forth, such as particular techniques and applications in order to provide a thorough understanding of the present invention. However, it will be apparent to one skilled in the art that the present invention may be practiced in other embodiments that depart from these specific details. In other instances, detailed descriptions of well-known methods and apparatuses are omitted so as not to obscure the description of the present invention with unnecessary details.

Figure 1:
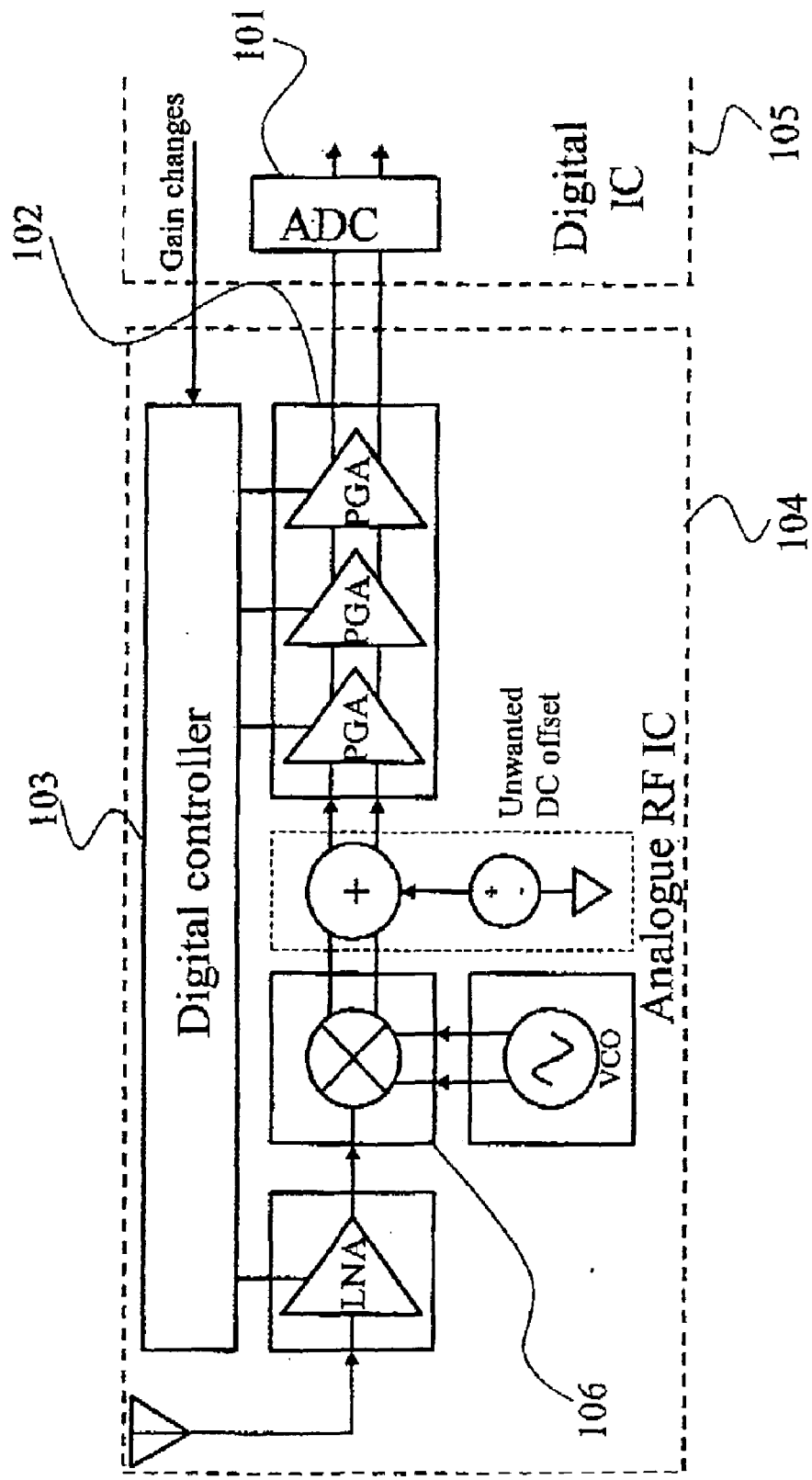
FIG. 1 is a receiver according to the prior art disclosing the introduction of a DC component in the received signal due to imperfections in components.

In FIG. 1 a receiver according to the prior art disclosing the introduction of a DC component in the received signal due to imperfections in components is shown. FIG. 1 has been briefly discussed in connection with the background of the invention and will not be further described.

Figure 2:
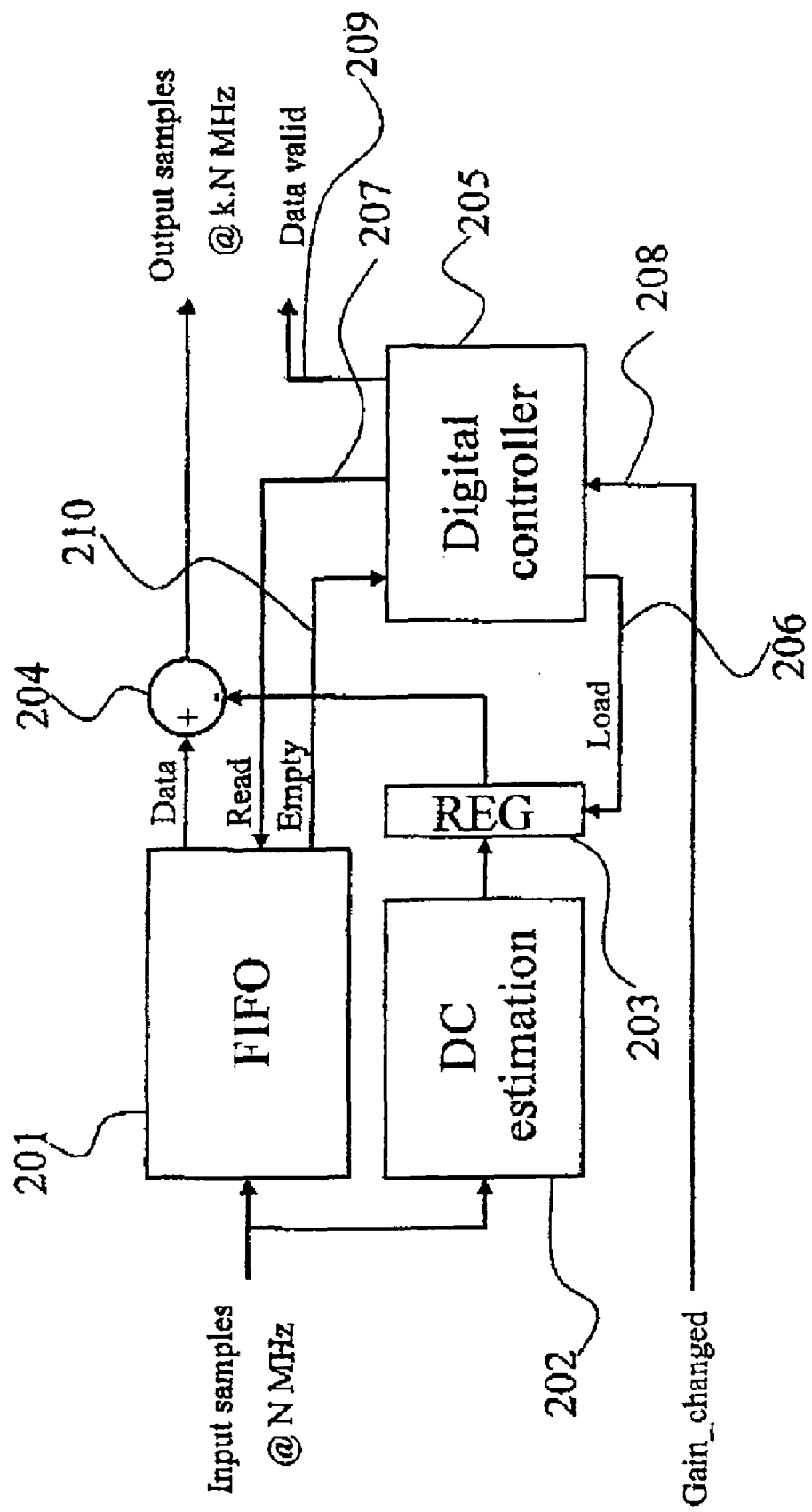
FIG. 2 is a schematic block diagram of an apparatus according to a preferred embodiment of the invention.

In FIG. 2 a schematic block diagram of an apparatus according to a preferred embodiment of the invention is shown. A FIFO (first in-first out) buffer 201 receives input signal samples from the ADC 101 in FIG. 1. The samples are also fed to a DC estimation circuit 202, which in turn is connected to a register 203. The output of the FIFO buffer 201 is connected to an adder 204, which also is connected to the register 203. The adder is arranged to subtract the value in the register 203 from the samples received from the output of the FIFO buffer 201.

A digital controller 205 comprises a first terminal 206 connected to the register 203, a second terminal 207 connected to the FIFO buffer 201 and a third terminal 208 connected to a automatic gain control (not shown). The automatic gain control is also connected to the digital controller 103 in the analogue RF circuit 104 in FIG. 1, and arranged to order gain changes of the amplification stage 102. A signal "Gain_changed" is provided by the automatic gain control function on the third terminal 208, with timing such that it is asserted during the first input sample where the updated gain applies.

The digital controller further comprises a fourth terminal 209 connected to circuitry (not shown) arranged to receive signal samples from the FIFO buffer via the adder 204, and a fifth terminal 210 connected to the FIFO buffer 201.

Figure 3:
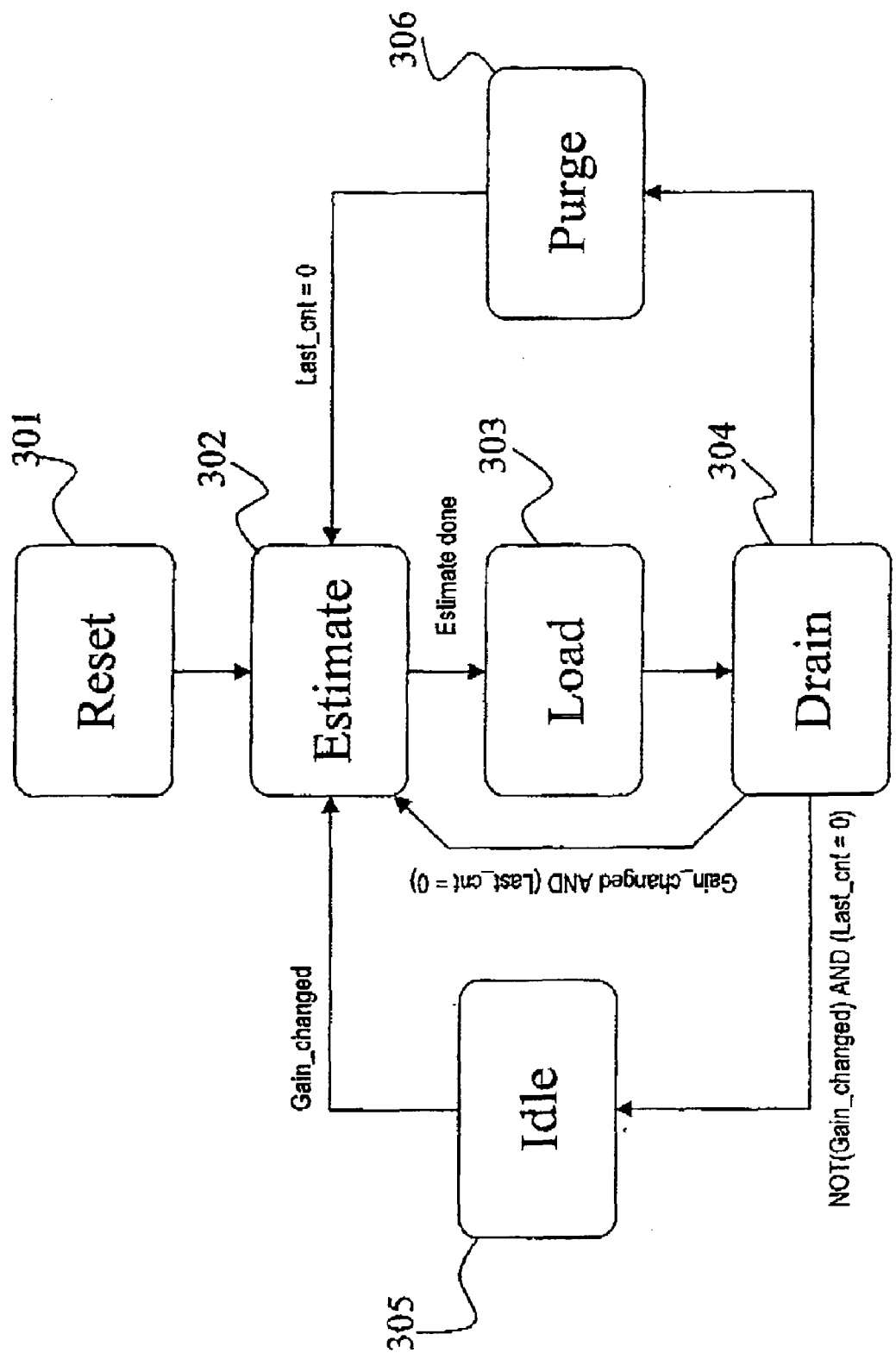
FIG. 3 is a state diagram for carrying out a method in the apparatus disclosed in FIG. 2, according to a preferred embodiment of the invention.

The operation of the digital controller 205 in FIG. 2 will now be described with reference to FIG. 2 and FIG. 3.

At a state RESET 301, the digital controller 205 is either turned on for the first time, or is restarted. Obviously the apparatus has not had time yet to perform a DC estimation so the register 203 is empty. Thus the digital controller 205 immediately continue to a ESTIMATE state 302. Arriving in the ESTIMATE state 302, the digital controller 205 holds the second terminal 207 low, which prevents the FIFO buffer 201 from presenting received samples on the output to the adder 204. The fourth terminal 209 is also kept low to indicate to downstream circuitry that no signal samples are available.

The FIFO buffer 201 receives signal samples and stores them in its internal memory. Likewise, the DC estimation circuit 202 will receive the same samples and will calculate an estimation of the DC component from the received samples. This can be achieved with for instance a moving average over a specified number of samples. The digital controller 205 also counts the number of samples in a variable Last_cnt.

When the DC estimation circuit has received the required number of samples, the digital controller 205 continues to a LOAD state 303. In the LOAD state the digital controller 205 raise the first terminal 206, which causes the register 203 to load the calculated DC estimate from the DC estimation circuit 202. The digital controller 205 then continues to a DRAIN state 304 after again lowering the first terminal 206 thus preventing the value in the register 203 from changing.

In the DRAIN state 304 the digital controller 205 raises the second terminal 207 and the fourth terminal 209 allowing downstream circuitry to receive signal samples from the FIFO buffer 201. The signal samples are corrected in the adder 204 with the DC estimate value stored in the register 203.

The signal samples are read out from the FIFO buffer 201 at a higher rate than new signal samples are received and thus the FIFO buffer will soon be empty. The variable Last_cnt is increased when new samples arrive at the FIFO buffer 201 and decreased when samples are read out from the FIFO buffer 201. Thus, the variable Last_cnt contains the number of samples stored in the FIFO buffer 201 for the current DC estimate value. When the FIFO buffer 201 is empty it raises the fifth terminal 210 on the digital controller 205.

If, at this moment, the third terminal 208 has not been raised that is, the automatic gain control is keeping the same gain for the amplifier stage 102, the digital controller 205 continues to an IDLE stage 305. In the IDLE state 205 the digital controller 205 keeps the fourth terminal 209 low while the FIFO buffer indicates that it is empty to indicate for downstream circuitry that no valid data is present. When a new sample arrives at the input to the FIFO buffer 201, the FIFO buffer 201 lowers the fifth terminal 210 and the digital controller 205 raises the fourth terminal 209, indicating the presence of valid data, which is then read out from the FIFO buffer 201 without delay.

If, however, the third terminal 208 is raised just as the final sample is read from the FIFO buffer 201, the digital controller 205 continues to the ESTIMATE state 302 to perform a new DC estimate.

If the third terminal 208 is raised while the digital controller 205 is in the IDLE state 305, the digital controller 205 continues to the ESTIMATE state 302.

If, while the digital controller 205 is in the DRAIN state, the third terminal 208 is raised, the digital controller 205 continues to PURGE state 306. In the PURGE state 306 the FIFO buffer 201 still contains samples from a signal, which has been amplified in the amplifier stage 102 using a first gain previously set by the automatic gain controller. Thus, to accurately correct the samples stored in the FIFO buffer 201, the presently calculated DC estimate value, stored in the register 203, should be used. Therefore, the samples in the FIFO buffer are read out and corrected using the DC estimate value stored in the register 203, while new samples arriving at the FIFO buffer is stored in the FIFO buffer and used by the DC estimation circuit 202 to calculate a new DC estimate value. Once the "old" samples have been read out the digital controller 205 continues to the ESTIMATE state for calculating a new DC estimate value. Thus, no "new" values are read out until a new DC estimate is ready.

Figure 4:
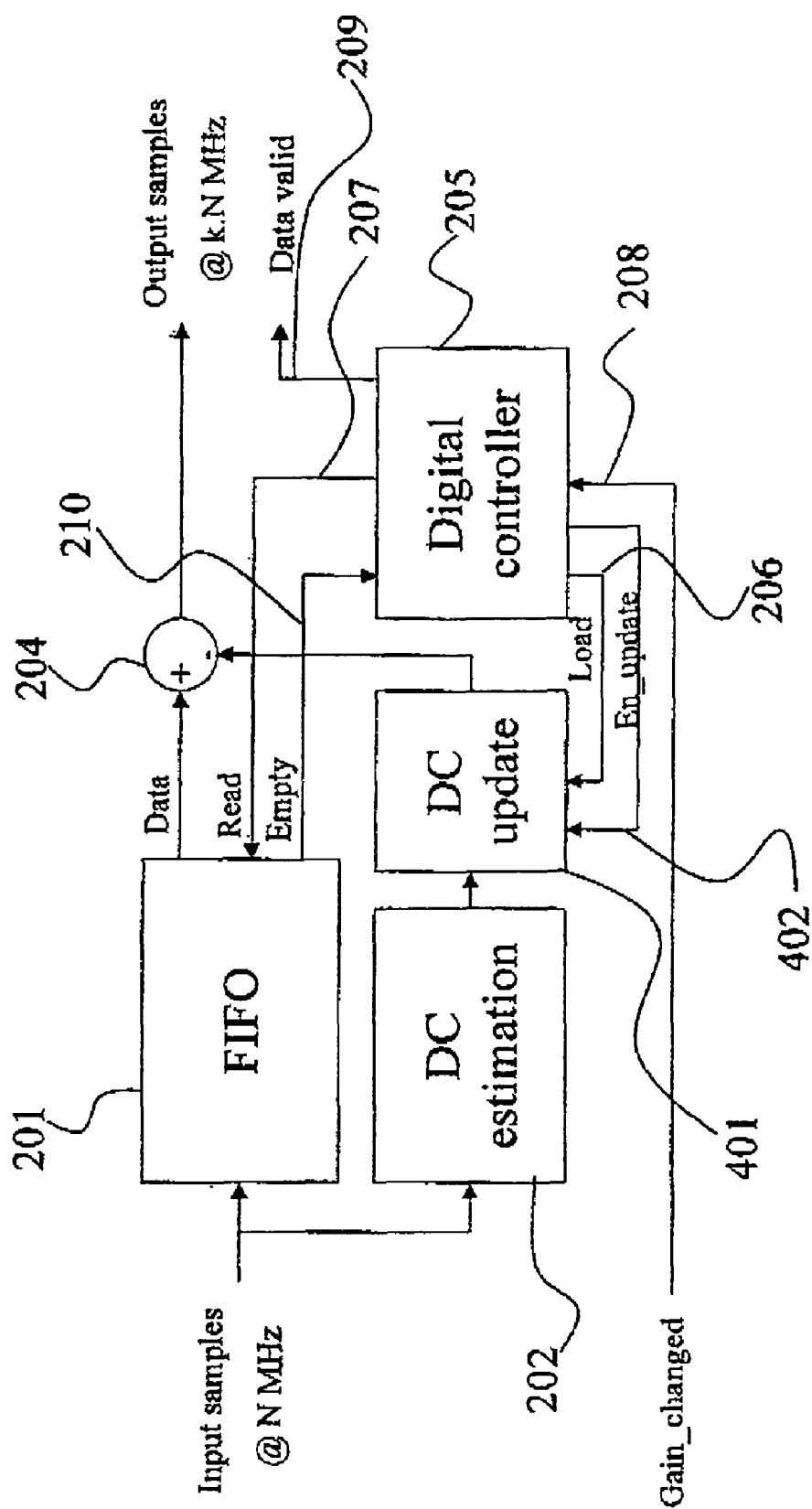
FIG. 4 is a schematic block diagram of an apparatus according to another preferred embodiment of the invention.

In FIG. 4 a schematic block diagram of an apparatus according to another preferred embodiment of the invention is shown. Similar features in FIGS. 2 and 4 are denoted with same reference numerals. An enhancement to the embodiment described in connection with FIGS. 2 and 3 is shown in FIG. 4, where the initial estimate is continually updated according to new samples after the initial estimation period.

In the embodiment in FIG. 4 the register 203 in FIG. 2 has been replaced with a DC update circuit 401 and the digital controller 205 has been supplied with a sixth terminal 402 connected to the DC update circuit 401. The function of the embodiment in FIG. 4 is the same as for the embodiment described in connection with FIGS. 2 and 3 with regards to the calculation of an initial DC estimate.

During the calculation of the initial DC estimate the sixth terminal 402 is kept low by the digital controller 205. Once an initial DC estimate value has been calculated, the digital controller 205 continues to the LOAD stage 303 and the calculated DC estimate value is loaded into the DC update circuit 401. The digital controller then continues to the IDLE state 305 and the sixth terminal 402 is kept high. In the IDLE state 305 the DC update circuit 401 receives incoming signal samples and continuously calculates an updated DC estimate value, which is used in correcting signal samples from the FIFO buffer 201.

A suitable algorithm for updating the DC estimate value in the DC update circuit 401 is to use a recursive filter with difference equation:

$$y(n)=ax(n)+(1-a)y(n-1)$$

where a is a small value, typically a negative power of 2, e.g. $\frac{1}{8}$, $\frac{1}{16}$. The value is chosen to provide a suitable trade-off between estimation accuracy and convergence time on the optimum estimate.

The sixth terminal is also kept high in the DRAIN stage 304.[11]. It is thus possible to use a low number of samples for the first DC estimate value and then continuously improve the estimate as new samples arrive.

It may not be possible in all systems to guarantee that no gain changes will occur during a DC estimation. For example, an initial DC estimate may be necessary when leaving reset on detecting signal energy, followed quickly by a change of gain to bring the signal into a suitable working range. In such a case, it is desirable to be able to interrupt an ongoing DC estimate, and begin a new estimate while reading out the samples associated with the interrupted estimate using the best estimate that could be made with the samples available.

Figure 5:
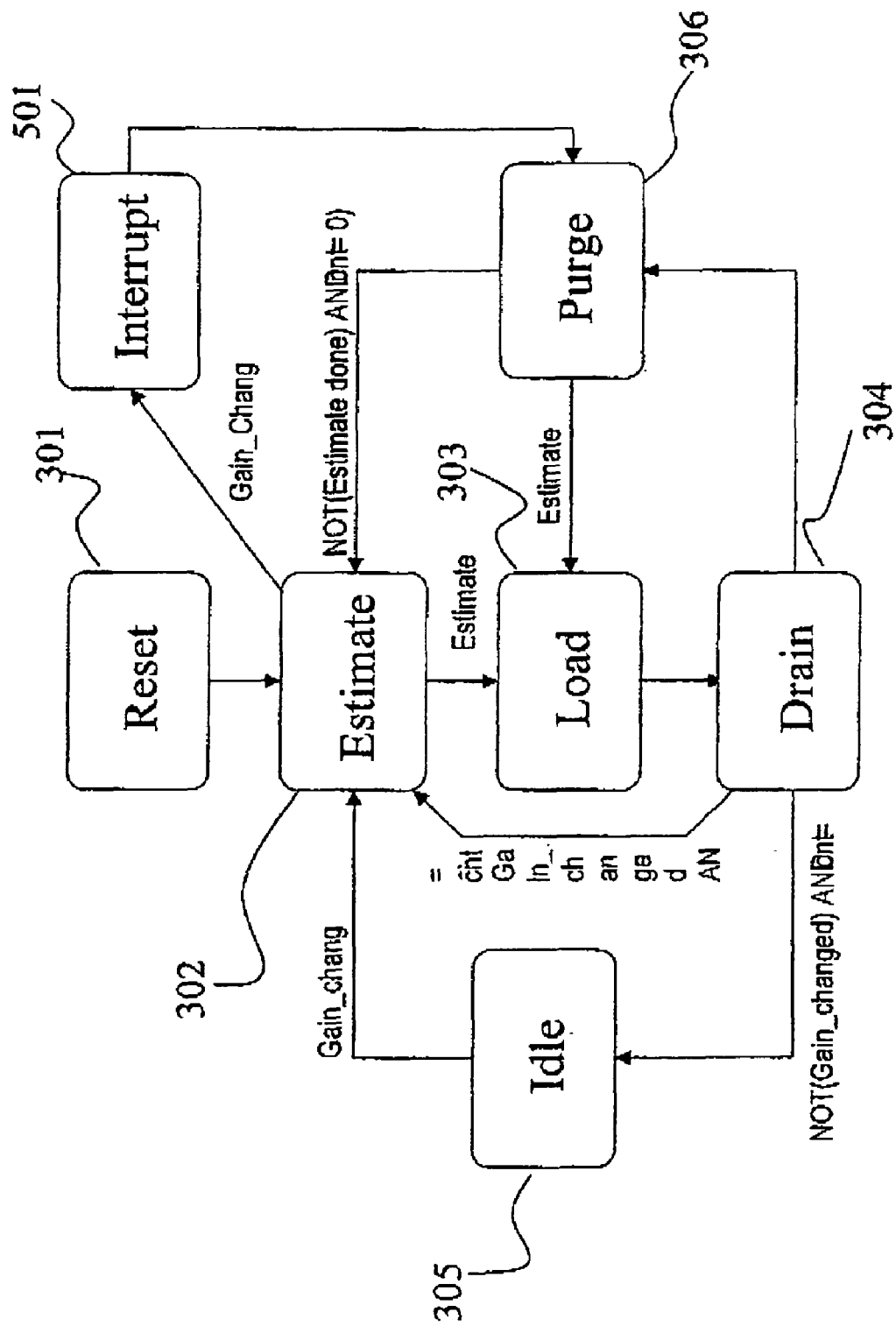
FIG. 5 is a state diagram for carrying out a method according to another preferred embodiment of the invention.

In FIG. 5 a state diagram for carrying out a method according to another preferred embodiment of the invention is shown. Similar features in FIGS. 3 and 5 are denoted with same reference numerals.

The only difference between the embodiment described in connection with FIG. 3 and the present embodiment is the introduction of a INTERRUPT state 501. This is to allow for the automatic gain controller to raise the third terminal 208 during an ongoing DC estimate. When this happens the digital controller transits to the state INTERRUPT 501. A variable Last_cnt is set with the number of samples stored during the interrupted estimate and the so far calculated DC estimate value is loaded into the register 203 or the DC update circuit 401. The digital controller continues to the PURGE state 306, where the samples stored in the FIFO buffer 201 is read out and corrected with the interrupted DC estimate value.

It is a straightforward enhancement to the interruptable embodiment in FIG. 5 to support an arbitrary number of interruptions. The single variable Last_cnt and the single value for the last DC estimate taken may be replaced by FIFO buffers that can store an arbitrary number of DC estimates and associated values of Last_cnt.

On entering the INTERRUPT or LOAD states, the present DC estimate is loaded into the DC estimate FIFO, and the number of samples associated with that DC estimate are stored in the Last_cnt FIFO. The appropriate number of samples associated with each DC estimate value can then be read out, at which point a new DC estimate and a new value of Last_cnt can be read from the FIFOs until no further estimates and associated samples remain.

In situations where the maximum number of interruptions cannot be known in advance, and to provide additional robustness, it is possible to add a further ERROR state that is entered when more than the number of supported interruptions to DC estimates occurs. In the ERROR state, the output of the FIFO buffer is released and samples are read until no further data is stored in the FIFO buffer storing samples. It may also be desirable to enable continuous update of the DC estimate. The ERROR state is left by transition to IDLE when the FIFO buffer comprising samples is empty.

It will be obvious that the invention may be varied in a plurality of ways. Such variations are not to be regarded as a departure from the scope of the invention.

Even though some embodiments of the invention has been described using a hardware terminology it is obvious to the man skilled in the art that the functionality may be implemented in software. In that case the terminals referred to above may be Boolean variables or software signals.

It is for instance fairly common in signal processing systems to have multiple clocks, e.g. when using oversampling of analogue to digital converters with subsequent digital downsampling. By using the "data valid" signal to gate the clock signal to subsequent signal processing functions, power consumption can be kept to near that of a system clocked at the lower sampling rate.

The invention has been described for the purpose of DC estimation and compensation; however, any other spurious signal may be estimated for the purpose of compensation, or many other types of estimation may be performed, e.g. channel estimation, frequency offset estimation, etc.

All such modifications as would be obvious to one skilled in the art are intended to be included within the scope of the appended claims.

I claim:

1. An apparatus for performing DC estimation of a received signal and DC correction of said received signal, said apparatus comprising:
   an automatic gain control circuit arranged to change the gain of an amplifier stage in dependence of the received signal strength,
   a FIFO buffer comprising an input and an output, wherein said input is coupled to said amplifier stage for receiving said signal,
   a DC estimation circuit coupled to said amplifier stage and provided to perform an estimation of the DC component in said signal, said DC estimation circuit is further connected to said output of said FIFO buffer and provided to subtract said DC estimation from the signal on the output from said FIFO buffer, and
   a digital controller coupled to said FIFO buffer and to said DC estimation circuit, said digital controller is provided to control said FIFO buffer to store incoming samples and prevent output from said FIFO buffer during a period when said DC estimation circuit calculates said DC estimation.

2. The apparatus according to claim 1, wherein
   said amplifier stage is provided to operate on an analogue signal,
   said apparatus further comprises an analogue-to-digital converter for converting said amplified analogue signal to a digital signal, and
   said analogue-to-digital converter is coupled to said FIFO buffer and to said DC estimation circuit.

3. The apparatus according to claim 2, wherein
   said first in
   first out buffer and said DC estimation circuit are provided to receive samples from said digital signal at a first rate and said FIFO buffer is provided to present samples on said output at a second rate, and
   said second rate is higher than said first rate.

4. The apparatus according to claim 1, wherein
   said apparatus comprises a register for storing a DC estimate,
   said register is coupled to a first terminal on said digital controller and to said DC estimation circuit,
   said digital controller is provided to raise said first terminal to order said register to load and store a DC estimation value from said DC estimation circuit,
   said register is further coupled to the output of said FIFO buffer and provided to subtract the value of said stored DC estimate from the output from said FIFO buffer.

5. The apparatus according to claim 1, wherein
   said digital controller comprises a second terminal coupled to said FIFO buffer,
   said digital controller is provided to raise said terminal to allow said FIFO buffer to present signals on said output, and to lower said second terminal to prevent said FIFO buffer from present signals on said output.

6. The apparatus according to claim 1, wherein
   said digital controller comprises a third terminal coupled to said automatic gain control,
   said automatic gain control is provided to raise said third terminal when said automatic gain control has changed the gain for said amplifier stage.

7. The apparatus according to claim 6, wherein
   said digital controller is provided to lower said second terminal and to count the number of samples received by said DC estimation circuit when said third terminal is raised,
   said digital controller is further provided to raise said first terminal and, after that, raise said second terminal when said DC estimate circuit has received a predetermined number of samples.

8. The apparatus according to claim 1, wherein
   said DC estimation circuit is provided to continuously calculate new DC estimates after a first DC estimate has been calculated, and provided to use said new DC estimate when correcting subsequent samples.

9. An apparatus for performing DC estimation of a received signal and DC correction of said received signal, said apparatus comprising:
   an automatic gain control circuit;
   an amplifier stage coupled with said automatic gain control circuit;
   a FIFO buffer comprising an input and an output, wherein said input is coupled to said amplifier stage,
   a DC estimation circuit coupled to said amplifier stage
   a subtractor coupled with said FIFO buffer output and said DC estimation circuit, and
   a digital controller coupled to said FIFO buffer and to said DC estimation circuit, said digital controller is provided to control said FIFO buffer to store incoming samples and prevent output from said FIFO buffer during a period when said DC estimation circuit calculates said DC estimation.

10. The apparatus according to claim 9, wherein
    said amplifier stage is provided to operate on an analogue signal,
    said apparatus further comprises an analogue
    to
    digital converter for converting said amplified analogue signal to a digital signal, and
    said analogue-to-digital converter is coupled to said FIFO buffer and to said DC estimation circuit.

11. The apparatus according to claim 10, wherein
    said digital controller comprises a second terminal coupled to said FIFO buffer,
    said digital controller is provided to raise said terminal to allow said FIFO buffer to present signals on said output, and to lower said second terminal to prevent said FIFO buffer from present signals on said output.

12. The apparatus according to claim 10, wherein
    said digital controller comprises a third terminal coupled to said automatic gain control,
    said automatic gain control is provided to raise said third terminal when said automatic gain control has changed the gain for said amplifier stage.

13. The apparatus according to claim 12, wherein
    said digital controller is provided to lower said second terminal and to count the number of samples received by said DC estimation circuit when said third terminal is raised,
    said digital controller is further provided to raise said first terminal and, after that, raise said second terminal when said DC estimate circuit has received a predetermined number of samples.

14. The apparatus according to claim 10, wherein
    said DC estimation circuit is provided to continuously calculate new DC estimates after a first DC estimate has been calculated, and provided to use said new DC estimate when correcting subsequent samples.

15. The apparatus according to claim 9, wherein
    said apparatus comprises a register for storing a DC estimate, said register is coupled to a first terminal on said digital controller and to said DC estimation circuit, said digital controller is provided to raise said first terminal to order said register to load and store a DC estimation value from said DC estimation circuit, said register is further coupled to the output of said FIFO buffer and provided to subtract the value of said stored DC estimate from the output from said FIFO buffer.

16. The apparatus according to claim 15, wherein said first in-first out buffer and said DC estimation circuit are provided to receive samples from said digital signal at a first rate and said FIFO buffer is provided to present samples on said output at a second rate, and said second rate is higher than said first rate.

* * * * *